United States Patent [19]

McCartney

[11] Patent Number: 4,736,158

[45] Date of Patent: Apr. 5, 1988

[54] WIRE IDENTIFYING APPARATUS FOR IDENTIFYING WIRES OF A MULTIPLE WIRE ELECTRICAL SYSTEM

[76] Inventor: Richard McCartney, 523 E. 3rd St., Waverly, Ohio 45690

[21] Appl. No.: 878,686

[22] Filed: Jun. 26, 1986

Related U.S. Application Data

[63] Continuation of Ser. No. 576,334, Feb. 2, 1984.

[51] Int. Cl.$^4$ .................. G01R 19/00; G01R 31/02
[52] U.S. Cl. ............................ 324/66; 324/510
[58] Field of Search ............... 324/51, 52, 54, 66, 324/96; 179/175.3 A, 175.3 F

[56] References Cited

U.S. PATENT DOCUMENTS

| | | | |
|---|---|---|---|
| 3,288,945 | 11/1966 | McNair, Jr. et al. | 179/175.3 |
| 3,375,334 | 3/1968 | Robinson | 179/175.3 A |
| 3,644,687 | 2/1972 | Richards, Jr. | 179/175.3 |
| 3,728,616 | 4/1973 | Cheek et al. | 324/66 X |
| 3,740,644 | 6/1973 | Schag et al. | 324/66 |
| 4,415,855 | 11/1983 | Dubauskas | 324/96 X |
| 4,578,636 | 3/1986 | Bakke et al. | 324/66 |

FOREIGN PATENT DOCUMENTS 618032  4/1961  Canada ................... 324/66

OTHER PUBLICATIONS

Craggs, Identification of New Cable Pairs, pp. 178–179.

Livingstone, Cable Identification in Strain Gauge Installations, "Strain", vol. 10, No. 2, p. 91, Apr. 1974.

*Primary Examiner*—Gerard R. Strecker
*Assistant Examiner*—Jack B. Harvey
*Attorney, Agent, or Firm*—William L. Fisher

[57] ABSTRACT

Wire identifying apparatus for identifying wires of a multiple wire electrical system as the wires extend between one location and another, said wire identifying apparatus comprising two separate units for use at the two locations, respectively, and designated herein as Unit No. 1 and Unit No. 2, Unit No. 2 having a plurality of terminals for connecting to one end of the wires to be identified and having a ground terminal, Unit No. 2 also having an array of resistors connected in parallel circuit with each other between the ground terminal and the other terminals, there being a different resistor corresponding to each of the other terminals, Unit No. 1 having a plurality of terminals for connecting to the opposite end of the wires to be identified and having a ground terminal, Unit No. 1 also having electrical circuitry including a selector switch having multiple positions corresponding to the number of terminals on Unit No. 1 and a multi-digit read-out display and such that, when the selector switch is moved from terminal to terminal on Unit No. 1, the numbers assigned to the wires on Unit No. 2 will read out on the digital display of Unit No. 1.

3 Claims, 2 Drawing Sheets

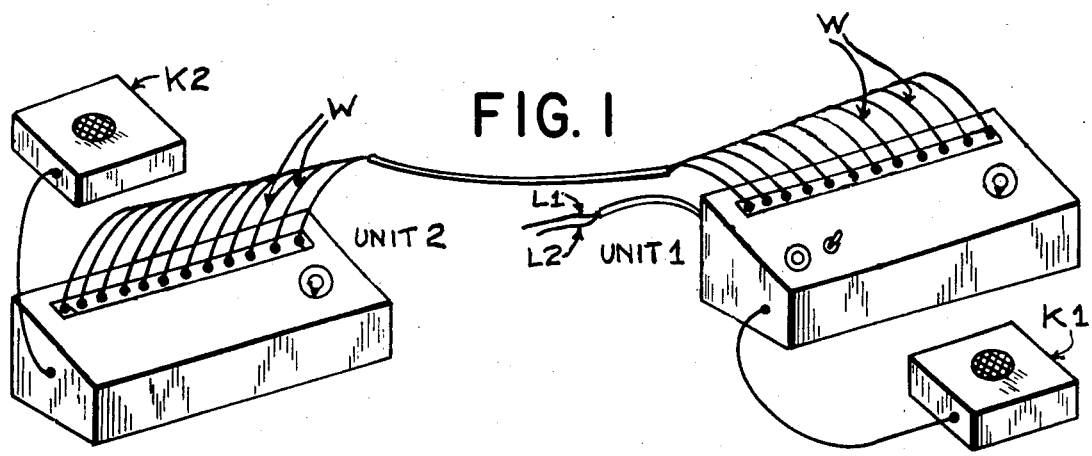
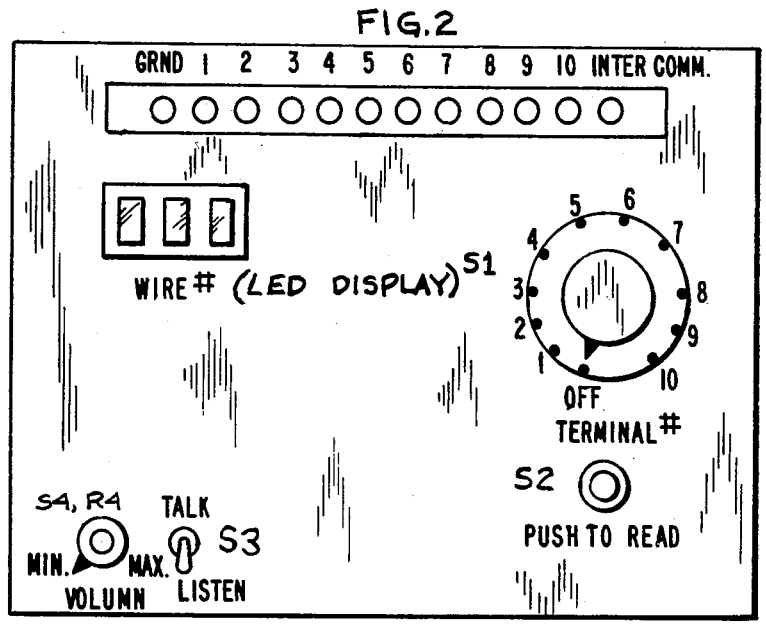
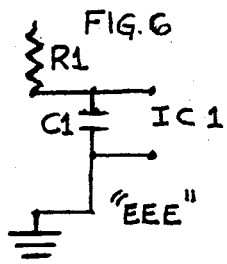
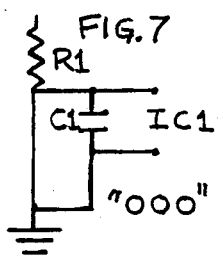
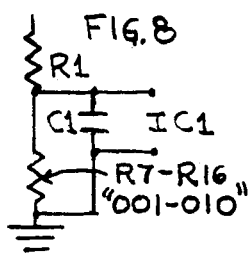
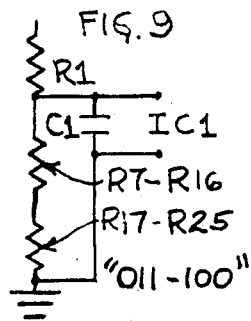
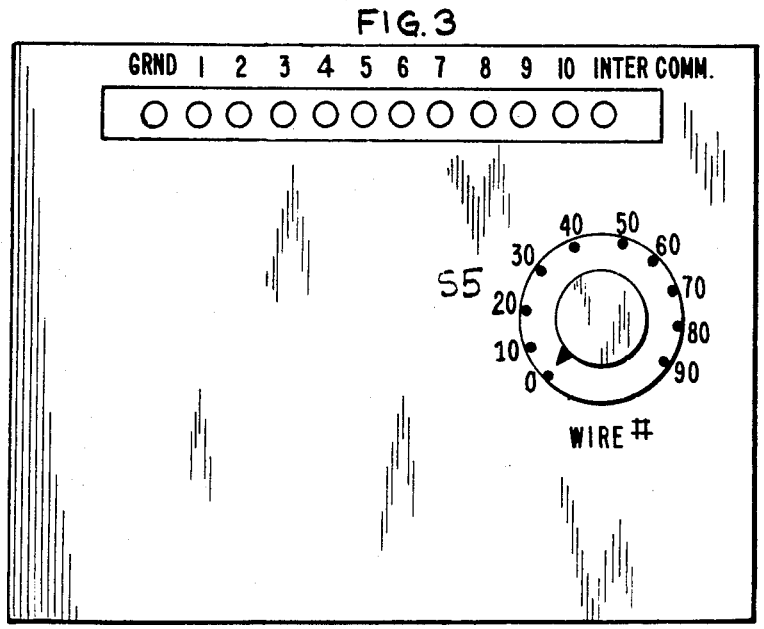

UNIT 1

UNIT 2

WIRE IDENTIFYING APPARATUS FOR IDENTIFYING WIRES OF A MULTIPLE WIRE ELECTRICAL SYSTEM

My present application is a continuation of my prior application Ser. No. 576,334 filed Feb. 2, 1984.

My invention relates to a conductor identifier instrument and has for its object the provision of such an instrument which is simple of construction, easy to operate and exceptionally reliable for identifying electrical conductors such as those maintained in wiring harnesses, conduits, trays and the like.

The foregoing object of my invention and the advantages thereof will become apparent during the course of the following description, taken in conjunction with the accompanying drawings, in which:

BRIEF DESCRIPTION OF THE DRAWINGS

FIG. 1 is a perspective view of a conductor identifier instrument embodying my invention;

FIGS. 2 and 3 are respective plan views of separate units of said instrument;

FIGS. 6–9 are respective schematic diagrams of parts of said circuitry further illustrating the principle of operation thereof.

DETAILED DESCRIPTION OF THE INVENTION

Figure 4:
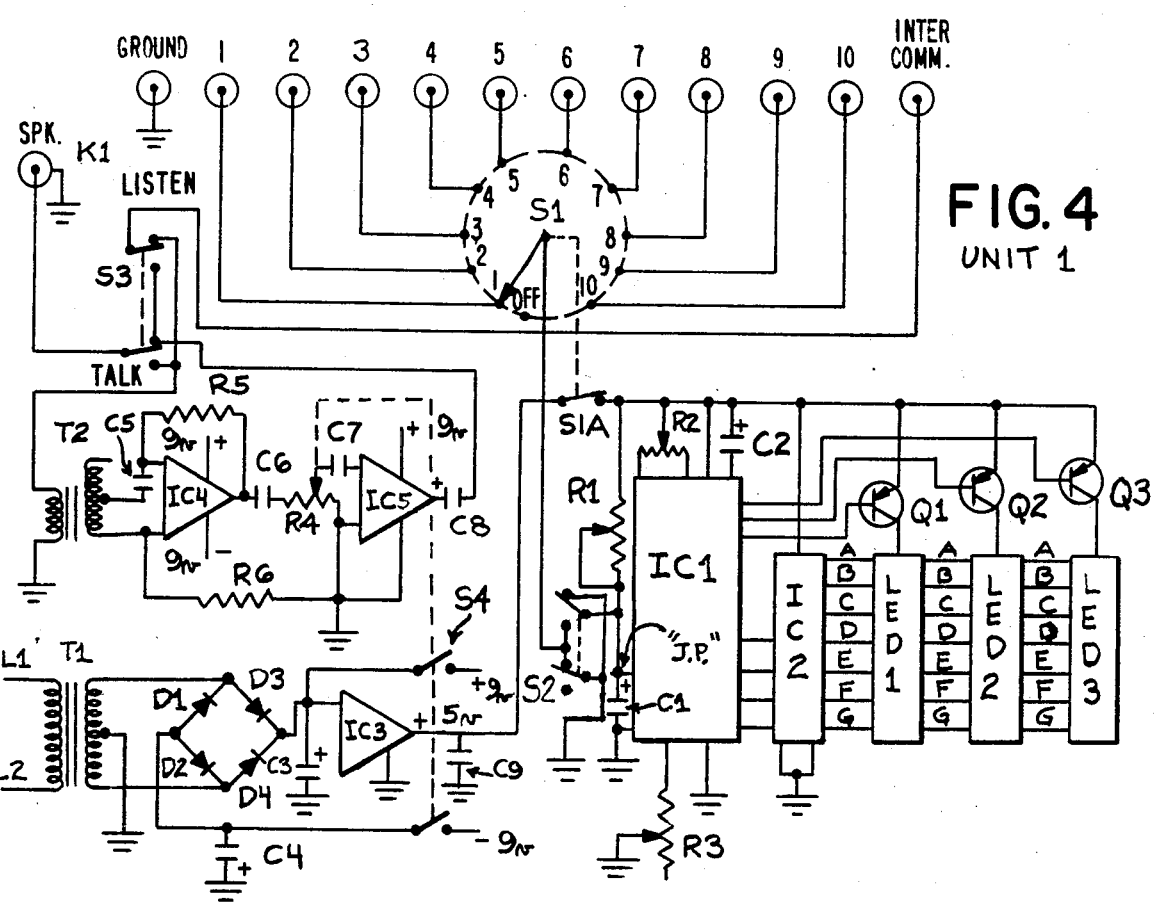
FIGS. 4 and 5 are respective schematic diagrams of electrical circuitry contained in said units.
Figure 5:
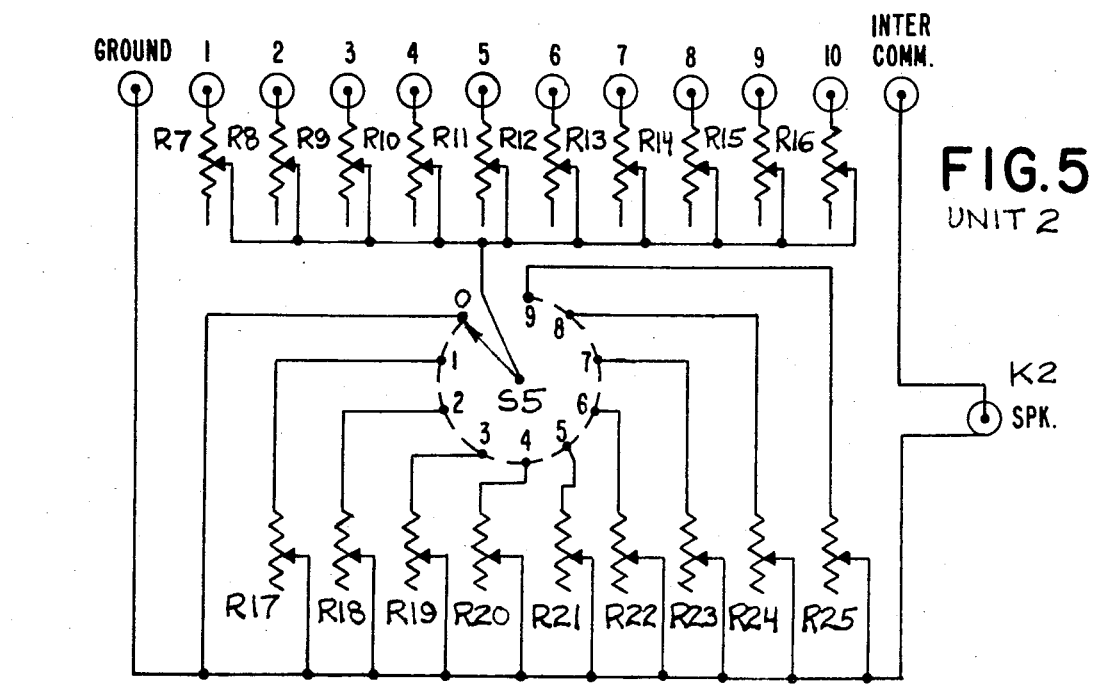

Referring to the drawings in greater detail, said conductor identifier instrument consists of two separate Units, identified as Unit #1 and Unit #2, having housings, as shown, provided with terminal strips, to which a plurality of wires "W" are connected, as shown. In the instance, the terminal strips are labeled "Ground", "1", "2" etc. thru "10" and "Inter Comm". Unit #1 is also provided with a rotary switch S1 labeled "Terminal #", a "Push to Read" switch S2, a "Talk-Listen" switch S3, a volume (audio) switch S4 (ganged to potentiometer R4) and a three place LED display. Unit #2 is also provided with a rotary switch labeled "Wire #". The circuitry shown in FIG. 4 is contained in the housing for Unit #1 and that shown in FIG. 5 is contained in the housing for Unit #2. Two speakers K1, K2 are provided which are stored in the housing for Unit #2. Outside A.C. power, indicated at L1, L2, is brought to transformer T1 and rectified by the bridge rectifier, D1 thru D4, to supply +5 volts and +/−9 volts D.C. to power an audio amplifier circuit which includes a pre-amplifier IC4 and an amplifier IC5. Intercom switch S3, when in "Talk" position connects speaker K1 in series circuit with the primary of transformer T2 (to produce a pulsating current flow therein) and, when in "Listen" position does likewise with speaker K2. The output of the secondary of transformer T2 is fed to the input of pre-amplifier IC4. The other speaker, in each instance, is connected to the output of power amplifier IC5 so that when the Units #1 and #2 are at remote locations, communication can be had between the users thereof ("Intercom" and "Ground" wires having been previously connected between the terminal strips of both said Units). A voltage regulator IC3 is used to tap off from the +9 volt D.C. supply, a regulated 5 volt D.C. supply for powering a converter (analog to digital) IC-1, a decoder driver (7 segment) IC2 and three LED displays (7 segment): LED 1, LED 2 and LED 3.

The construction and operation of said conductor identifier instrument will appear from the more detailed description which follows. The ends of ten wires W to be identified are attached to terminals 1–10 of Unit #2 and consecutively tagged or numbered 1–10. The "Ground" terminals of both Units are suitably grounded or an identified wire is connected therebetween to serve as a ground connection. If audio communication is desired, another identified wire is connected between the two "Inter Comm." terminals. Switch S5 of Unit #2 is set at position "0". In this position, resistors R7–R16 are in circuit from terminals 1–10 to ground terminal of Unit #2. The other ends of these ten wires are attached to terminals 1–10 of Unit #1, (FIGS. 1 and 4); this will complete a circuit from Unit #2 to Unit #1.

Switch S1 is ganged to switch S1A such that the latter is open when the former is in "OFF" position and closed when the former is in its ten "ON" positions, 1–10. When switch S1 is turned to position "1", a circuit will be completed from ground through switch S5 of Unit #2 via one of the resistors R7–R16 back to terminal #1 of Unit #1 through switch S1 and switch S2 to ground. By grounding switch S1 when switch S2 is undepressed, a circuit is completed so that any static or induced voltage in the wires to be identified will be discharged to protect the circuit of Unit #1 (FIG. 4). At the same time the input of IC-1 is grounded to insure a zero reading for zero input. FIG. 7 illustrates this condition. FIG. 6 illustrates another condition as when S-2 is depressed and there is an open between S-1 and S-5.

When switch S-2 of Unit #2 is pressed, the circuit is now completed from ground through one resistor of resistors $R_7$–$R_{16}$, Unit #2, back to terminal #1 of Unit #1 through S-1 to S-2 to the input of IC-1 (an analog to digital converter). $R_1$ of Unit #1 and the particular resistor of the group of resistors, $R_7$–$R_{16}$ of Unit #2 act as a voltage divider network. FIG. 8 illustrates this condition. Such divided voltage is applied to the input of IC-1, (Unit #1) which reads this divided voltage and changes it to a Binary Coded Decimal number which is then fed to IC-2, (a B.C.D. decoder driver) which drives LEDs (from 1 to 10). Wire on terminal #1 of Unit #1 is then labeled with the correct identifying number as read off the L.E.D. display on Unit #1 (FIG. 2). This sequence is repeated through each remaining position (position 2-10) of S-1 (Unit #1); this will identify all of the wires 1–10 on Unit #1. A second set of ten wires is connected between the terminals 1–10 of both Unit #1 and Unit #2, the same as for the first set. Switch S5 of Unit #2 is set to position #1; this will add R-17 to the voltage divider network, which will in turn add ten to the numbers at terminals 1–10 of Unit #2. These terminals will, in effect, be terminals 11 through 20 and the wires connected thereto will be numbered or labelled 11–20. The reason for the adding of 10 to the terminals of Unit #2 is that the previous voltage divider network of R1 and one of the resistors R7–R16 is altered in that resistor R17 is now placed in the leg of the voltage divider network containing one of the resistors R7–R16 so as to be in series circuit therewith. FIG. 9 illustrates this condition. The procedure at Unit #1 is repeated, thus the second set of wires are correctly labeled from 11–20. The sequence can be continued (adding, via rotation of switch S5, one of the resistors R18 through R25 to the voltage divider divider network in lieu of resistor R17) to number further bundles of wires from 21–30, 31–40 etc. to 90–100 etc. until all wires are identified. The embodiment shown is for labelling wires in bundles of 10 which is more than adequate for all practical purposes. The conductor identifier instrument could be constructed to label more than 10 times per bundle, as is presently shown, or many wires at one time.

Unit #1, FIG. 4, contains electronics for:
LED readout of wire numbers
Power Supply
Amplifier for intercom
R1-R2-R3 Internal Adjustments, respectively, for "Input", "Gain" and zeroing of IC-1
R4 Volume Control (Intercom) and interconnected on-off switch SW4
R5 and R6 feedback resistors
C1-C4 and C-9 Surge/filter capacitors
C5-C8 Coupling capacitors
S1 Terminal selector and power
S2 press to read
S3 intercom switch
S4 intercom switch power
IC-1 Analog to Digital Converter
IC-2 Seven segment Decoder Driver
IC-3 Voltage Regulator
IC-4 Pre-Amplifier
IC-5 Power Amplifier
LED 1 through LED 3 Seven segment light emitting diode
Q1 through Q3 PNP Transistor
Unit #2, FIG. 5, contains electrons for:
Resistors R7-R25 which are preset and need no external adjustment
Rotary Switch S5

The value of resistors R1 through R5 and capacitors C-1 through C-9 are as follows: R1, R3, R4 and R22 through R25=10K ohm potentiometer; R2=50K ohm potentiometer; R5 and R6=100K ohms; R7 through R16=1K ohm potentiometer; R17 through R21=5K ohm potentiometer; (R7 through R16 are set at 50 ohm increments beginning with R7 equal to 50 ohms. R17 through R25 are set at 500 ohm increments beginning with R17 equal to 500 ohms); C1, C5 and C9=10 mfd; C2=0.33 mfd; C3 and C4=2200 mfd; C6=0.033 mfd; C7=470 mfd; and C8=20 mfd.

R7 is set to divide the voltage with R1 so that the analog input (at the junction point of said voltage divider network) is such as to cause wire #1 to appear on the LED display of Unit #1. R8-R16 divide the voltage with R1 so that they cause wire #s 2-10 to appear on the display of Unit #1.

R17 adds to the resistance of R7-R16 and with the sum thereof divides the voltage with resistor R1 so that tens are added to each number at terminals 1-10 of Unit #2 which are displayed on Unit #1. Likewise, R18-R25 each add ten to each number at terminals 1-10 of Unit #2 which are displayed on Unit #1; thus making it possible for reading displays of 11-20; 21-30; 31-40 etc to 91-100.

While this description of my invention describes my Conductor Identifier Instrument, as shown, this does not limit it to this embodiment alone. Other embodiments could number wires with any number of digits or with letters or combinations of letters and digits. Also, identification of wires can be accomplished by numbering the wires on Unit #2 not in sequence and reading this same non-sequence identification on the readout of Unit #1.

As to suitable ground: in most conduit, a green grounding conductor is pulled along with other conductors; this is most suitable in areas where welding is being performed. If not available, the building ground or conduit may be used to identify the first two wires which may then be used for ground and intercom connections of Unit #1 and Unit #2.

If a wire to be identified has a break in it or if it is not connected in the circuit, the LED display will read "EEE" which is an over-range condition (that is, the voltage input to IC-1 is more than 99 millivolts). If, in trouble-shooting a circuit of a known wire, a reading of "EEE" is displayed, it would indicate an open in the wire. If the wire under test was shorted to ground, the LED display would read "000".

In further illustration of applicant's conductor identifier instrument, let it be assumed that the 10 wires on Unit #2 (tagged from left to right from #1 to #10) are actually joined to Unit #1 in the following sequence (unknown to anyone until the user operates the wire # display on Unit #1): 7,2,5,10,1,3,6,9,4 and 8. As the user of Unit #1 rotates rotary switch S1 through its 10 positions and depresses the "Push to Read" switch S2, he will be placing (one at a time) in series circuit with resistor R, the array of resistors R7-R16 in the following sequence: "R7", "R2", "R5", "R10", "R1", "R3", "R6", "R9", "R4" and "R8" from which different analog inputs will be obtained at the junction point (indicated at "J.P." in FIG. 4) of said voltage divider network for entry into the analog to digital converter IC-1 to drive the decoder driver IC-2 and light up the LEDs #1-3 with wire numbers in the sequence: "7", "2", "5", "10", "1", "3", "6", "9", "4" and "8". Thus, all 10 wires on Unit #1 are identified and the ends thereof tagged accordingly.

It will thus be seen that there has been provided by my invention a conductor identifier instrument in which the object set forth, together with many thoroughly practical advantages, has been successfully achieved. While a preferred embodiment of my invention has been shown and described, it is to be understood that changes and variations may be resorted to without departing from the spirit of my invention as defined by the appended claims.

What I claim is:

1. Wire identifying apparatus for identifying wires of a multiple wire electrical system as the wires extend between one location and another, said wire identifying apparatus comprising two separate units for use at the two locations, respectively, and designated herein as Unit No. 1 and Unit No. 2, Unit No. 2 having a plurality of terminals for connecting to one end of the wires to be identified and having a ground terminal, Unit No. 2 also having an array of resistors connected in parallel circuit with each other between the ground terminal and said plurality of terminals, there being a different resistor corresponding to each of said plurality of terminals, Unit No. 1 having a plurality of terminals for connecting to the opposite end of the wires to be identified and having a ground terminal, Unit No. 1 also having rectifier means producing a power supply, a resistor connected to said power supply and a selector switch having multiple positions corresponding to the number of terminals on Unit No. 1, said Unit No. 1 resistor interconnected with said selector switch so that as the latter is moved from terminal to terminal on Unit No. 1, the former is placed in series circuit with different ones of the resistors of the Unit No. 2 array of resistors to form a voltage divider having a junction point, "JP", said Unit No. 1 also having an analog to digital converter, a decoder driver, a plurality of 7-segment digital read-out devices forming a multi-digital read-out display, and a plurality of transistors, the input of the analog to digital converter being connected to the junction point "JP", the output of the analog digital converter being connected to the input of the decoder-driver and to the transistors, the digital read out devices being connected serially to the output of the decoder-driver and, respectively, to the transistors, the voltage at the junction point "J.P." relative to ground to be applied to the analog to digital converter corresponding to which one of the resistors of the Unit No. 2 array are placed in series circuit with the Unit No. 1 resistor, whereby when said selector switch is moved from terminal to terminal on Unit No. 1, the numbers assigned to the wires on Unit No. 2 will read out on the digital display of Unit No. 1.

2. Wire identifying apparatus for identifying wires of a multiple wire electrical system as claimed in claim 1 further comprising Unit No. 2 having a second array of resistors and a selector switch herein designated the second selector switch, said second selector switch having multiple positions corresponding to the number of resistors in said second array, said second array of resistors interconnected with said second selector switch so that as the latter is moved from resistor to resistor in said second array, different ones thereof are placed in series circuit both with said Unit No. 1 resistor and with one of the resistors of the Unit No. 2 first array of resistors, whereby to extend the range of said wire-identifying apparatus 100% over the range of the apparatus of claim 1.

3. Wire identifying apparatus for identifying wires of a multiple wire electrical system as claimed in claims 1 or 2 comprising an intercommunication system between said Units, said intercommunication system consisting of an "Inter-Communication terminal" on each of Unit No. 1 and Unit No. 2, an audio amplifier, a volume control and a Talk-Listen Double-Pole Double-Throw (D.P.D.T.) switch S3 in one of the Units, a speaker in each Unit having one side thereof connected to the respective ground terminal and the other side thereof connected to a terminal of said D.P.D.T. switch so that when one speaker is connected to the input of said audio amplifier, the other speaker is connected to the output thereof, whereby users of said Units can vocally communicate with each other, each speaker being removable from its respective Unit and being portable in respect thereto.

* * * * *